(12) United States Patent
Wagner

(10) Patent No.: US 7,943,016 B2
(45) Date of Patent: May 17, 2011

(54) MAGNETRON SPUTTERING APPARATUS

(75) Inventor: Israel Wagner, Sargans (CH)

(73) Assignee: Oerlikon Solar AG, Truebbach, Truebbach (CH)

( * ) Notice: Subject to any disclaimer, the term of this patent is extended or adjusted under 35 U.S.C. 154(b) by 1040 days.

(21) Appl. No.: 11/577,576

(22) PCT Filed: Dec. 16, 2005

(86) PCT No.: PCT/CH2005/000755
§ 371 (c)(1),
(2), (4) Date: May 11, 2007

(87) PCT Pub. No.: WO2006/063484
PCT Pub. Date: Jun. 22, 2006

(65) Prior Publication Data
US 2007/0261952 A1    Nov. 15, 2007

Related U.S. Application Data

(60) Provisional application No. 60/637,164, filed on Dec. 17, 2004.

(51) Int. Cl.
*C23C 14/35* (2006.01)
(52) U.S. Cl. ............ 204/192.12; 204/298.2; 204/298.19
(58) Field of Classification Search ............. 204/192.12, 204/298.2, 298.19
See application file for complete search history.

(56) References Cited

U.S. PATENT DOCUMENTS 5,833,815 A * 11/1998 Kim et al. ................ 204/192.12
2005/0145478 A1* 7/2005 Tepman ................... 204/192.12
* cited by examiner

*Primary Examiner* — Rodney G McDonald
(74) *Attorney, Agent, or Firm* — Notaro, Michalos & Zaccaria P.C.

(57) ABSTRACT

The magnetron sputtering arrangement (2) comprises a target arrangement (3) comprising a target ($3_{a1}$) having a sputtering surface (4) the shape of which defines a first (A1 and a second axis (A2) being mutually perpendicular and being, at least approximately, axes of mirror-symmetry of the sputtering surface; a magnet arrangement (40) generating a magnetic field above said sputtering surface; and a drive (70) adapted to establishing a substantially transitional relative movement between said magnetron magnetic field and said sputtering surface. Said relative movement describes a path (80) defining a third (A3) and a fourth axis (A4) being mutually perpendicular and being, at least approximately, axes of mirror-symmetry of the path (80). Said third axis is at least approximately parallel to said first axis (A3), and said path (80) has at least two pointed corners (81), each corner located on one of said third axis (A3) and said fourth axis (A4). Preferably, the relative movement is a repetitive movement, and preferably the path describes substantially the shape of a rhombus. The magnetron sputtering arrangement (2) may comprise at least two of said target arrangements (3), magnet arrangements (40) and drives (70).

37 Claims, 11 Drawing Sheets l = 8 ... 24 cm w = 8 cm m = 1 ... 3

T = 2 ... 4 sec t = 0.1 ... 0.2 sec ically extended single targets side by side.
MAGNETRON SPUTTERING APPARATUS The present application claims the benefit of U.S. provisional application Ser. No. 60/637,164, filed Dec. 17, 2004, which is hereby incorporated by reference in its entirety.

TECHNICAL FIELD

The invention relates to the field of magnetron sputtering. It relates to methods and apparatuses according to the preamble of the claims. Such methods and devices find application, e.g., in surface treatment technology, etching and coating.

BACKGROUND OF THE INVENTION

In one aspect, the present invention addresses the need for improved target utilization. Uptime and efficient use of material are important economical aspects of sputtering technology; the invention allows to enhance this aspect.

In another aspect the present invention is based on the need for depositing a film having a homogeneous thickness distribution, by means of sputter coating. In this respect the invention is useful for target arrangements of different sizes; be it single targets or large-area targets mounted from several longitudinally extended single targets side by side.

In a sputtering process, ions obtained from a working gas, typically Argon, are accelerated in an electric field towards a sputtering target comprising a sputtering material, and impinge on a sputtering surface of the target, and thereby remove material from the target.

In magnetron sputtering, be it reactive or non-reactive, a target arrangement may comprise a mounting plate and a target plate bonded to it, especially in the case of brittle, sintered material. The upside of the target plate defines the sputtering surface. The target is sputter-eroded along so-called "race tracks". On the sputtering surface a closed-loop, erosion furrow or trench is created due to closed-loop, tunnel-shaped magnetic fields ("magnetron magnetic fields") existing above the target and produced by magnet arrangements behind the target. These magnetic fields confine zones with elevated plasma density, which again act as electron traps. Such magnetic fields known in the art tend to generate very deep erosion at the edges and this is limiting the overall target utilization. The target lifetime is short, since the area of maximum erosion will limit the usability of the whole target. In order to improve the utilization of the target, the magnetron magnetic field can be moved relative to the sputtering surface.

U.S. Pat. No. 6,416,639 discloses a magnetron sputtering arrangement with such a relative movement. For further improvement of the deposition uniformity, U.S. Pat. No. 6,416,639 discloses the use of ferromagnetic pieces, which are fixed relative to the target, so as to alter the magnetic field, to which the sputtering surface is exposed (superposition of magnetron magnetic field and the field of the ferromagnetic pieces). Furthermore, U.S. Pat. No. 6,416,639 discloses various shapes of paths along which the relative movement can take place.

In DE 27 07 144 A1, further shapes of paths along which the relative movement can take place are disclosed.

Prior Art in general often addresses the issue of target utilization and film homogeneity with different focus, because sometimes proposed solutions can only fulfill one criterion. However, under today's needs both aspects are crucial, with regard to quality of the product (film homogeneity) and economical aspects (yield, maintenance, uptime, target utilization).

SUMMARY OF THE INVENTION

A goal of the invention is to create a magnetron sputtering arrangement with improved target utilization, which allows to produce on a substrate a sputter-coated film having a very uniform thickness distribution.

In addition, it is a goal of the invention is to create a corresponding sputter coating chamber comprising at least one magnetron sputtering arrangement according to the invention, a corresponding method of operating a magnetron sputtering arrangement, and a corresponding method of manufacturing at least one sputter-coated work piece.

An objective of the invention is to provide for a magnetron sputtering arrangement, which provides for a long target lifetime.

Another objective of the invention is to provide an improved full target erosion, i.e. to extend the sputter erosion on essentially all areas on the target to reduce (i. e. lower) the particle generation.

Another objective of the invention is to provide means to control the plasma distribution along the target "in situ", substantially without any changes to the magnetic structure or geometrical configuration of the cathode.

Another objective of the invention is to provide means to enhance the width of the erosion race track in the case of a target made of magnetic material.

These objectives are achieved by a magnetron sputtering arrangement and further apparatuses and methods according to the patent claims.

The magnetron sputtering arrangement comprises
- a target arrangement comprising a target having a sputtering surface the shape of which defines a first and a second axis being mutually perpendicular and being, at least substantially, axes of mirror-symmetry of the sputtering surface;
- a magnet arrangement generating a magnetic field above said sputtering surface; and
- a drive adapted to establishing a substantially transitional relative movement between said magnetic field and said sputtering surface;

said relative movement describing a path defining a third and a fourth axis being mutually perpendicular and being, at least approximately, axes of mirror-symmetry of the path, said third axis being at least approximately parallel to said first axis, and said path having at least two pointed corners, each corner located on one of said third axis and said fourth axis.

The pointed (sharp) corners ensure that the time during which the magnetron magnetic field is located at the corresponding place on the sputtering surface is rather short, so that excessive local target erosion is avoided.

In one embodiment, the target is of oblong shape, and a maximum extension of said sputtering surface parallel to said first axis is larger than a maximum extension of said sputtering surface parallel to said second axis. In one embodiment, the sputtering surface is of generally rectangular shape.

In one embodiment, the relative movement is a repetitive movement. The shape described by the repetitive movement does usually not need to be altered, if different sputtering profile and coating thickness, respectively, shall be realised. One can just change the number of cycles of the repetitive movement (or the time during which the repetitive movement is repeated) in order to adapt to other profile or thickness requirements. It is also possible to change the cycle time.

Furthermore, repetitive movements help to reduce (local) overheating of the target. A repetitive movement can be easily adjusted to the technical needs.

In one embodiment, the path has at least four pointed corners, each corner located at least substantially on one of said third axis and said fourth axis.

In one embodiment, the largest extension of the path parallel to the third axis is located on the third axis and/or the largest extension of the path parallel to the fourth axis is located on the fourth axis.

In one embodiment, the path describes substantially the shape of a rhombus. A rhombus-shaped path can be realised in a rather straightforward manner. Furthermore, the symmetry and alignment relative to the target of a rhombus and its straight-forward scalability allows for an improved target utilization.

In one embodiment, a value m representing the ratio of the maximum extension of the path parallel to the fourth axis to the maximum extension of the path parallel to the third axis is a value >0, in particular substantially between 0.01 and 10 or greater than 0.1 and smaller than 10, in particular between 0.3 and 3, more particularly between 0.38 and 2.6, even more particularly between 0.41 and 2.4.

In one embodiment, the value m is obtained in dependence of the material of the sputtering surface. It is known that the sputtering result depends on the sputtering material, in particular on the angular distribution of sputtered material (ADSM). This dependence can be well compensated for by adapting the value m, so as to achieve a good (uniform) sputter deposition result with different materials. It is even possible to retain, when changing sputtering materials, a good sputtering result by only adapting the value m, while keeping other system parameters constant, such as the magnetic and mechanical structure. In one embodiment, the maximum extension of the sputtering surface parallel to the first axis is at least four times, in particular at least six times, more particularly at least eight times the maximum extension of the sputtering surface parallel to the second axis. Such oblong-shaped sputtering surfaces and corresponding targets are well-suited for use in large-area sputtering. In one embodiment, the target is substantially bar-shaped.

In one embodiment, the magnetron sputtering arrangement comprises at least two, in particular at least three of said target arrangements, magnet arrangements, and drives. Such a sputtering arrangement is easily scalable for large-area sputtering.

In such an embodiment the drives can be embodied as one drive; the target arrangements can be substantially of the same kind; the magnet arrangements can be substantially of the same kind; the target arrangements can be mutually electrically isolated; and the paths may describe substantially the same shape.

A sputter coating chamber according to the invention comprises at least one magnetron sputtering arrangement according to the invention. It typically furthermore comprises at least one substrate holder for holding a substrate to be sputter-coated, arranged distant and opposite to said sputtering surface.

A vacuum coating facility according to the invention comprises at least one magnetron sputtering arrangement according to the invention.

According to the invention, the method of operating a magnetron sputtering arrangement comprising a target arrangement having a target having a sputtering surface the shape of which defines a first and a second axis being mutually perpendicular and being, at least approximately, axes of mirror-symmetry of the sputtering surface, comprises the steps of:
   generating a magnetic field above said sputtering surface; and
   moving, in a substantially translational movement, the magnetic field relative to said sputtering surface in such a way that the relative movement describes a path defining a third and a fourth axis being mutually perpendicular and being, at least approximately, axes of mirror-symmetry of the path, said third axis being at least approximately parallel to said first axis, and said path having at least two pointed corners, each corner located at least substantially on one of said third axis and said fourth axis.

In one embodiment, the method further comprises the steps of:
for each of the at least two pointed corners:
   reducing the velocity of the relative movement before reaching the pointed corner;
   increasing the velocity of the relative movement after having reached the pointed corner;
and further comprises the step of:
   moving, during said relative movement, the magnetic field relative to said sputtering surface at a substantially constant speed during at least 80%, in particular during at least 90%, more particularly during at least 95% of the time of the relative movement.

It has been found that the uniformity of the sputtering result can be improved when times of acceleration or deceleration are small or minimized. It can lead to an improved sputtering result when the speed of the relative movement is substantially constant along the path. Yet, in practice some deceleration and acceleration along the path has to take place for mechanical reasons.

The method of manufacturing at least one sputter-coated work piece, comprises, according to the invention, the steps of:
   arranging the at least one work piece opposite and in a distance to a sputtering surface having a shape defining a first and a second axis being mutually perpendicular and being, at least approximately, axes of mirror-symmetry of the sputtering surface;
   generating a magnetic field above said sputtering surface;
   moving, in a substantially translational movement, the magnetic field relative to said sputtering surface in such a way that the relative movement describes a path defining a third and a fourth axis being mutually perpendicular and being, at least approximately, axes of mirror-symmetry of the path, said third axis being at least substantially parallel to said first axis, and said path having at least two pointed corners, each corner located at least substantially on one of said third axis and said fourth axis;
   sputter-coating said at least one substrate.

According to the invention, the method for controlling an erosion profile across a sputtering surface of a sputtering target comprising sputtering material, which eroding takes place in a magnetron-sputtering process, in which a magnetic field is moved in a substantially translational movement relative to said sputtering surface in such a way that the relative movement describes a path defining a third and a fourth axis being mutually perpendicular and being, at least approximately, axes of mirror-symmetry of the path, said sputtering surface having a shape defining a first and a second axis being mutually perpendicular and being, at least approximately, axes of mirror-symmetry of the sputtering surface, and said third axis being at least substantially parallel to said first axis, comprises the step of:
   choosing a value m representative of a ratio of the maximum extension of the path parallel to the fourth axis to the maximum extension of the path parallel to the third axis in dependence of the sputtering material.

A further increase of the uniformity of the sputtering result may be obtained by varying the value m over the lifetime of the sputtering target The advantages of the methods correspond to the advantages of corresponding apparatuses.

Further preferred embodiments and advantages emerge from the dependent claims and the figures.

BRIEF DESCRIPTION OF THE DRAWINGS

Below, the invention is described in more detail by means of examples and the included drawings. The figures show.

The reference symbols used in the figures and their meaning are summarized in the list of reference symbols. The described embodiments are meant as examples and shall not confine the invention.

DETAILED DESCRIPTION OF THE INVENTION

The U.S. provisional application Ser. No. 60/637,164, filed Dec. 17, 2004, is hereby incorporated by reference in its entirety.

By "magnetron sputtering source", also referred to as magnetron sputtering arrangement, is herein understood a sputtering source having usually the following features:

A sputtering source with an electric field causing a discharge operated with DC, AC or mixed (AC and DC), or with pulsed DC. AC is therein to be understood as possibly extending up into the RF range. The source is usually operated under vacuum, but with a working gas, such as argon, at pressures up to a few mbar. In a known manner, additional, reactive gases can be mixed in for reactive processes.

Above the sputter surface of the target configuration a magnetron magnet arrangement generates a tunnel-shaped magnetic field, which, in a view onto the sputtering surface (surface to be sputtered), forms a closed loop. Viewed in a cross-sectional direction of the target configuration, at least a portion of the magnetic field emerges from the sputter surface and enters back into it again, approximately in the form of a tunnel arch. The sputtering surface (identical with or part of the target surface) forms one electrode (the cathode) of the plasma discharge gap, since positive ions must be accelerated onto the sputtering surface for the sputtering process.

A tunnel-form electron trap and a pronounced electron current results, the electron current circulating substantially in and along the loop of the tunnel-shaped magnetic field. In the region of said loop-shaped magnetic field this electron current produces a pronounced increase of the plasma density compared to the plasma density outside of said magnetic field loop.

Therewith, along the circulating electron current, referred to in the technical field as "race track", a substantially increased sputter rate results, which leads to an increasingly deepening erosion trench in the sputter surface, more precisely at the base of the tunnel-shaped circulating magnetic field.

Figure 1:
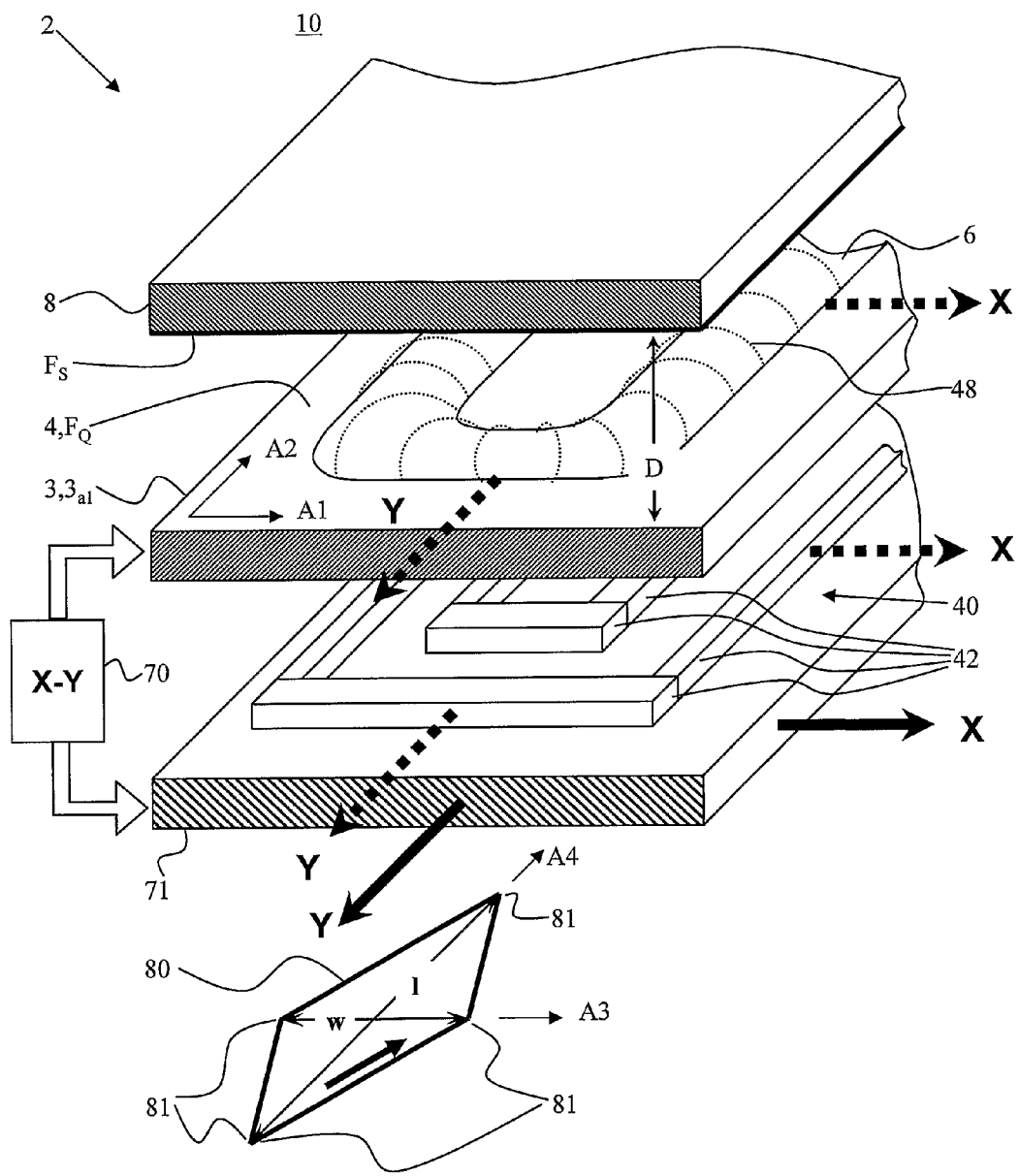
FIG. 1 a perspective view of a magnetron sputtering arrangement, schematically.

FIG. 1 shows schematically a perspective view of a magnetron sputtering arrangement 2. The sputtering arrangement 2 comprises a target arrangement 3, which comprises a target plate $3_{a1}$. The target plate $3_{a1}$ has a sputtering surface 4, which comprises sputtering material to be sputtered and has a surface area $F_O$. The target $3_{a1}$ is of substantially rectangular shape, through which two axes of mirror-symmetry A1 and A2 of the target are defined. The target $3_{a1}$ may have rounded corners. Below the target arrangement 3 (on the side opposite to the sputtering surface 4) a magnet arrangement 40 is located. It comprises several permanent magnets 42, which are arranged so as to create (generate) a magnetic field 48 above the sputtering surface 4, indicated in FIG. 1 by dotted lines 48 along magnetic field lines. The magnetron magnetic field 48 is a closed-loop tunnel-shaped magnetic field.

A magnetron sputtering source may comprise one or more magnetron sputtering arrangements 2.

In operation, the magnetron sputtering arrangement 2 is usually located in a process chamber 10 under vacuum containing a working gas, e.g., Argon (Ar) at pressures typically of the order of $10^{-3}$ mbar to $10^{-1}$ mbar. An electric field is applied near the sputtering surface 4, through which, in conjunction with the magnetic field 48, the well-known magnetron sputtering process is caused: working gas is ionized and working gas ions (e.g., $Ar^+$) are accelerated by means of an electric field towards the sputtering surface 4, so as to cause the ejection of sputtering material from the sputtering surface 4. Since the sputtering process is very intense within the closed-loop formed by the magnetron magnetic field 48 and rather weak elsewhere, plasma race tracks 6 are formed on the target 3.

A plasma race-track 6 is generated on the target 3 using the generated closed loop magnetic field 48. The closed-loop magnetic field is adapted to generate a plasma race-track on the target.

In order to improve the erosion profile across the sputtering surface 4, a drive 70 is provided, through which the magnet arrangement 40 can be moved relative to the sputtering surface 4. The drive 70 is functionally connected to the magnet arrangement 40 and the target 3 (indicated by the large open arrows in FIG. 1). The magnet arrangement 40 can be arranged on a base plate 71 moved by the drive 70. The drive 70 can be or comprise an X-Y-table or at least two spindles, e.g., motor-driven, and possibly computer-controlled. The relative movement (along coordinates X and Y) is a substantially transversal movement.

If, as indicated by the solid bold arrows in FIG. 1, the base plate 71 is moved and the target 3 remains stationary, the magnet arrangement 40 and the plasma race tracks 6 will be moved accordingly (see dashed bold arrows in FIG. 1). The lower part of FIG. 1 shows a path 80 of a relative movement (in a corresponding perspective view). The path 80 forms a shape, in particular a rhombus or diamond-shape like shown in FIG. 1. The path 80 has four pointed corners 81 and two axes A3 and A4 of mirror symmetry. The path 80 has a width w (along axis A3) and a length l (along axis A4).

The path 80 could be visualized, e.g., when fixing a pen to the bottom of the target 3 and writing onto the plate of the X-Y table (or the magnet arrangement) while making the relative movement.

The magnetron sputtering arrangement 2 of FIG. 1 can be used for homogeneously eroding the target 3 within the sputtering surface 4. It is also possible to use the magnetron sputtering arrangement 2 of FIG. 1 for coating a substrate 8, as shown in FIG. 1. The sputtered material will (partially) deposit on the substrate 8 arranged in a distance D substantially parallel to the sputtering surface 4 and form a coating or a film (indicated by the thick line at the substrate 8). The substrate 8 has a surface area $F_S$ to be coated.

The substrate 8 is typically held by means of a substrate holder (not shown in FIG. 1).

A target $3_{a1}$ (or target plate $3_{a1}$) is usually bar-shaped and comprises sputtering material. A target arrangement 3 comprises at least one target $3_{a1}$, typically also cooling means and holding means (target plate holder) for holding the target $3_{a1}$.

The sputtering surface 4 is the surface (of the target) to be sputter-eroded. The sputtering surface 4 is at least a part of the surface of the target plate $3_{a1}$, but may be smaller, in particular if a target plate holder extends onto the surface of the target plate $3_{a1}$.

Figure 2:
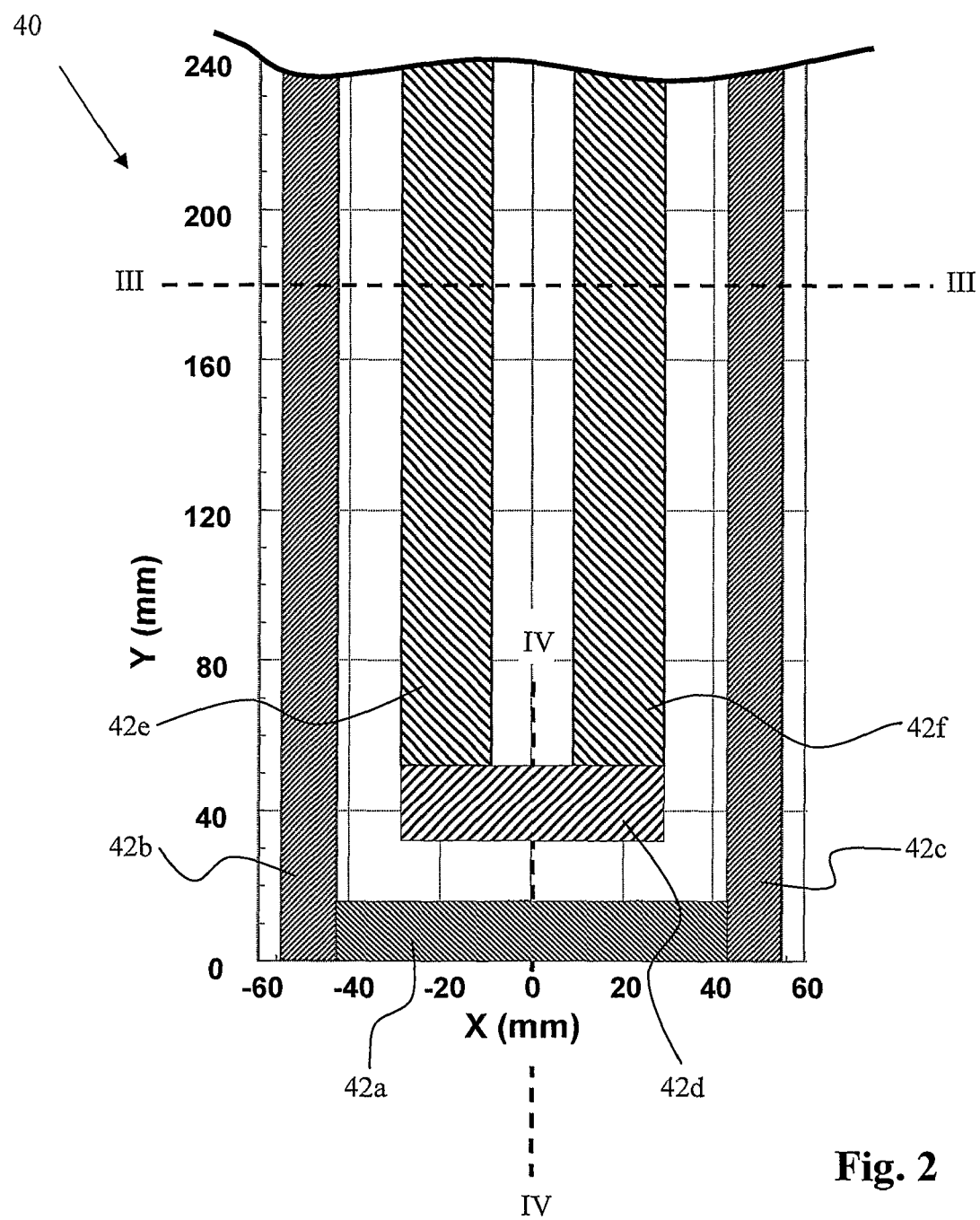
FIG. 2 a top-view of a magnet arrangement.

FIG. 2 shows a top-view of a part of a magnet arrangement 40. Length scales in X and Y directions are provided. The magnet arrangement 40 comprises several permanent magnets 42, of which permanent magnets 42a, 42b, 42c, 42d, 42e, 42f are shown in FIG. 2. The magnet arrangement 40 is symmetrical with respect to a Y=constant plane, e.g., to the Y=200 mm plane.

Figure 3:
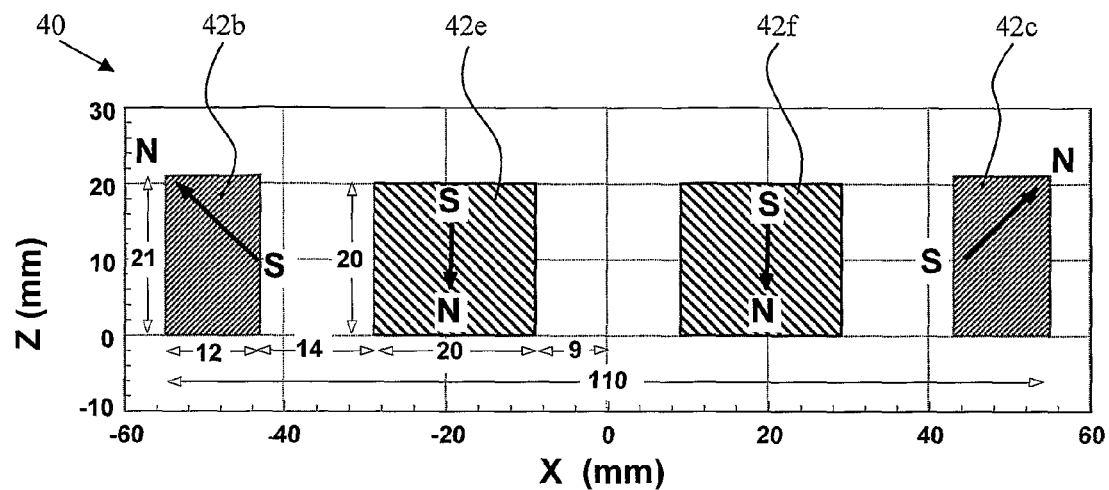
FIG. 3 section through the magnet arrangement of FIG. 2 in a Y=constant plane.
Figure 4:
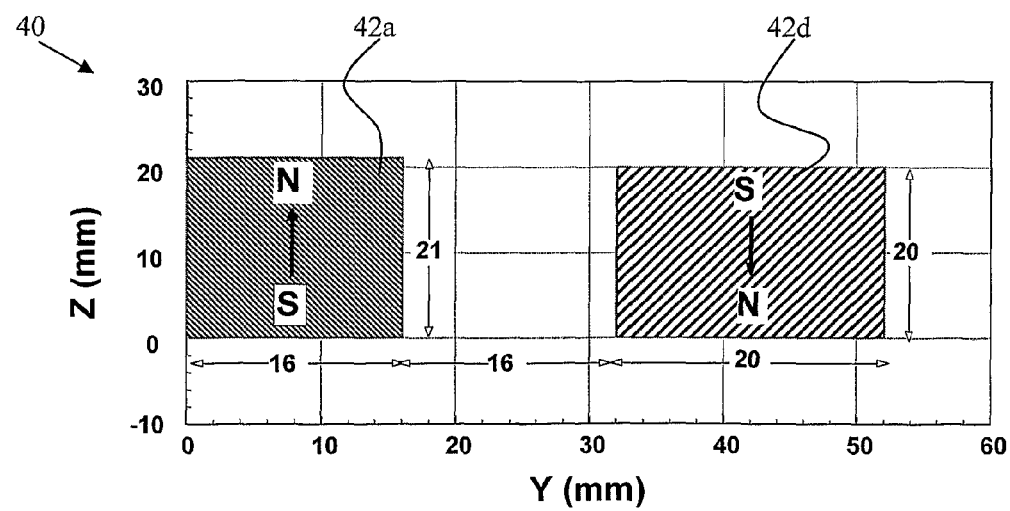
FIG. 4 section through the magnet arrangement of FIG. 2 in the X=0 plane.

FIGS. 3 and 4 are sections through the magnet arrangement 40 of FIG. 2 in the planes indicated by the bold dashed lines labelled III and IV, respectively, in FIG. 2. Scales are provided, and the alignment of the magnetic poles (N and S) are indicated.

The magnet configuration 40 shown in FIGS. 2 to 4 has been used for simulations discussed below. It is important to understand that this magnet arrangement 40 is only one possible configuration, and that the invention is not restricted to the one specific magnet configuration 40 but includes all possible magnet configurations (capable of generating a magnetron magnetic field).

The magnet configuration 40 presented in FIGS. 2 to 4 comprises substantially bar-shaped magnets 42a to 42f of magnetic orientations as shown in the Figures.

In FIG. 3 the magnetic orientation and the geometry of the bar-shaped permanent magnets 42b,42c,42e,42f is shown. The two center bars 42e,42f have perpendicular N-S orientation, whereas the magnets 42b,42c on the edges have an angled N-S orientation.

The cross-section of the magnet configuration 40 in FIG. 4 shows the magnetic orientation and geometry of the bar-shaped permanent magnets 42a and 42d. These magnets, which are located at the ends of the magnet arrangement 40 of FIGS. 2 to 4, have an perpendicular magnetic orientation.

FIGS. 5 to 11 show paths 80 of a relative movements of sputtering surface with respect to magnetron magnetic field. The axes A3 and A4 of mirror symmetry are indicated. The path 80 of FIG. 5 describes a rhombus or diamond. The shape has four pointed corners 81, two of them each lying on the axes A3 and A4, respectively. The shape is formed by a repetitive movement, which may take course in a counter-clockwise way as indicated by the bold arrow. The path 80 runs generally along the sides of a rhombus.

Figure 5:
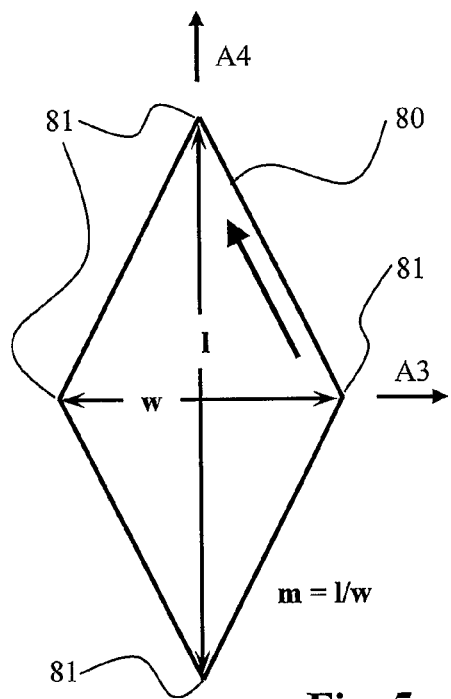
FIG. 5 path of relative movement.
Figure 6:
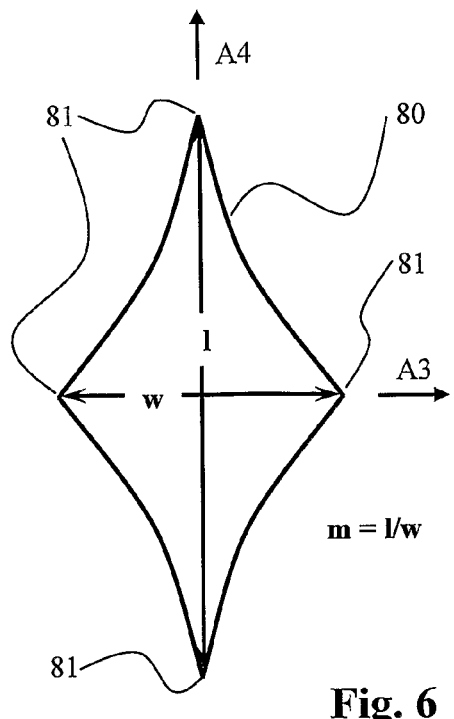
FIG. 6 path of relative movement.

FIG. 6 shows a rhombus-type shape formed by a path 80. Instead of being straight lines as in FIG. 5, the parts of the parts connecting the corners with each other are bent to the inside of the shape. This way, the time during which the relative position of the sputtering target and the magnetron magnetic field has a maximum along the axis A3 or A4 is decreased.

Figure 7:
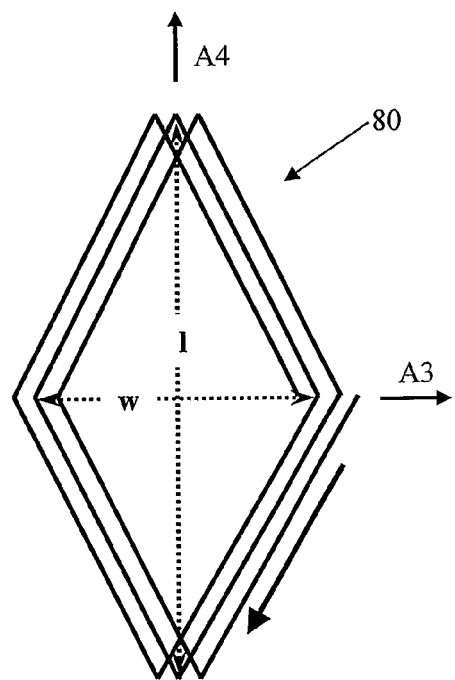
FIG. 7 path of relative movement.

FIG. 7 shows a path 80 similar to the one of FIG. 5. But during the repetitions the rhombus is slightly displaced. This leads to a somewhat blurred rhombus shape. It is also possible to make the whole blurred shape repetitive, e.g., if the movement along the path starts as indicated by the bold arrow, the single quasi-rhombuses are firstly placed to the left of each other, and after a while, the single quasi-rhombuses can then be placed to the right of each other, and all this repeats.

It is possible to arrange the path 80 of FIG. 7 such that the corners at minimum and maximum A3 coordinates substantially coincide, thus forming (clearly) pointed corners despite of the otherwise somewhat blurred shape. The same is true for the corners at minimum and maximum A4 coordinates.

Figure 8:
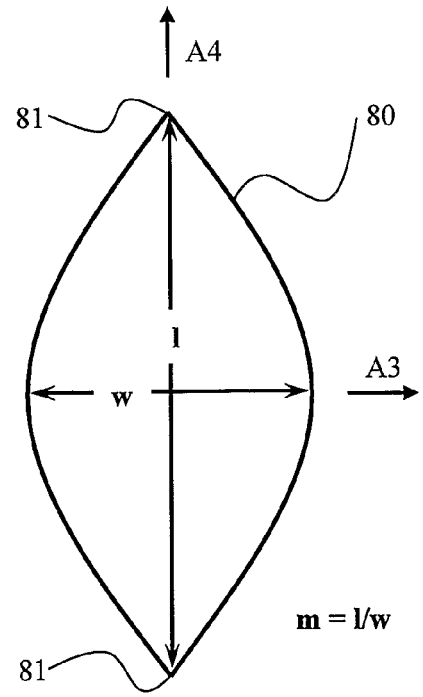
FIG. 8 path of relative movement.

FIG. 8 shows another path 80 of two-fold mirror symmetry. This shape 80 has only two pointed corners 81.

Figure 9:
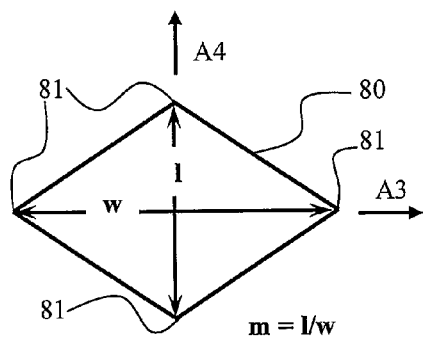
FIG. 9 path of relative movement.

FIG. 9 shows another rhombus-shaped path 80. The length l of that shape is smaller than in case of the otherwise identical shape 80 of FIG. 5. Accordingly, a value m, defined as the ratio of the maximum extension l of the path parallel to the fourth axis (length) to the maximum extension w of the path parallel to the third axis (width), is smaller than the value m of the shape shown in FIG. 5.

Figure 10:
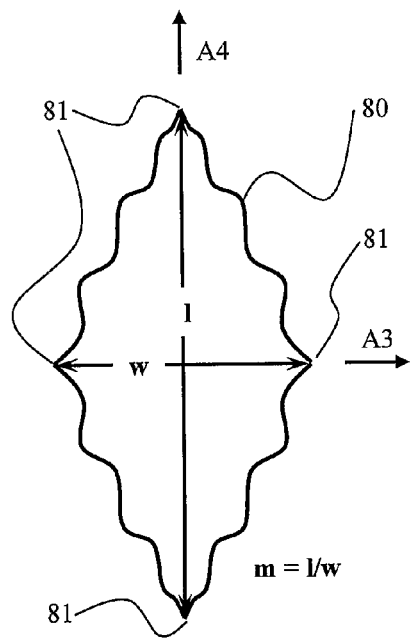
FIG. 10 path of relative movement.

FIG. 10 shows another rhombus-like shaped path 80. The otherwise straight lines (cf. FIG. 5) are in FIG. 10 multiply bent or curled.

Figure 11:
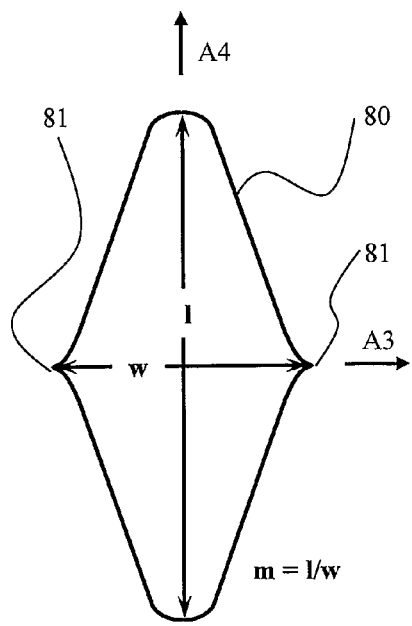
FIG. 11 path of relative movement.

FIG. 11 shows another path 80 with only two pointed corners 81. The corners on the axis A4 are rounded.

Figure 12:
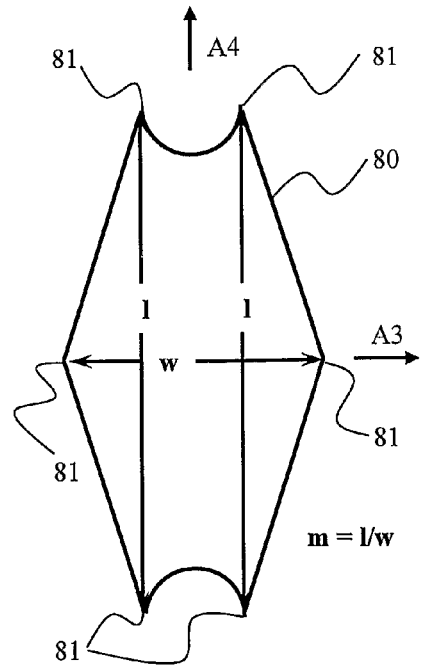
FIG. 12 path of relative movement.

FIG. 12 shows a path 80 with six pointed corners 81 and two axes A3, A4 of mirror symmetry.

It is possible to let the movement describe a path 80 having at least two, possibly even four pointed (sharp) corners 81, such that, when the shape described by the path is shifted (without rotating) in such a way, that a central point or the center of gravity of the shape matches the sputtering surface's central point or center of gravity, respectively, the at least two pointed corners 81 each substantially lie on an axis through the middle points of two sides of a rectangle, which rectangle approximates the shape of the sputtering surface. Such an approximating rectangle may, e.g., be found by a fitting procedure fitting the rectangle to the shape of the sputtering surface (e.g. by a least-square fitting method). The FIGS. 5 to 12 show such paths 80. Paths 80 could also have a less clear symmetry than those of FIGS. 5 to 12. E.g., the path could be slanted or skewed, usually in conjunction with a correspondingly slanted or skewed sputtering surface, e.g., a parallelogram-shaped sputtering substrate.

Figure 13:
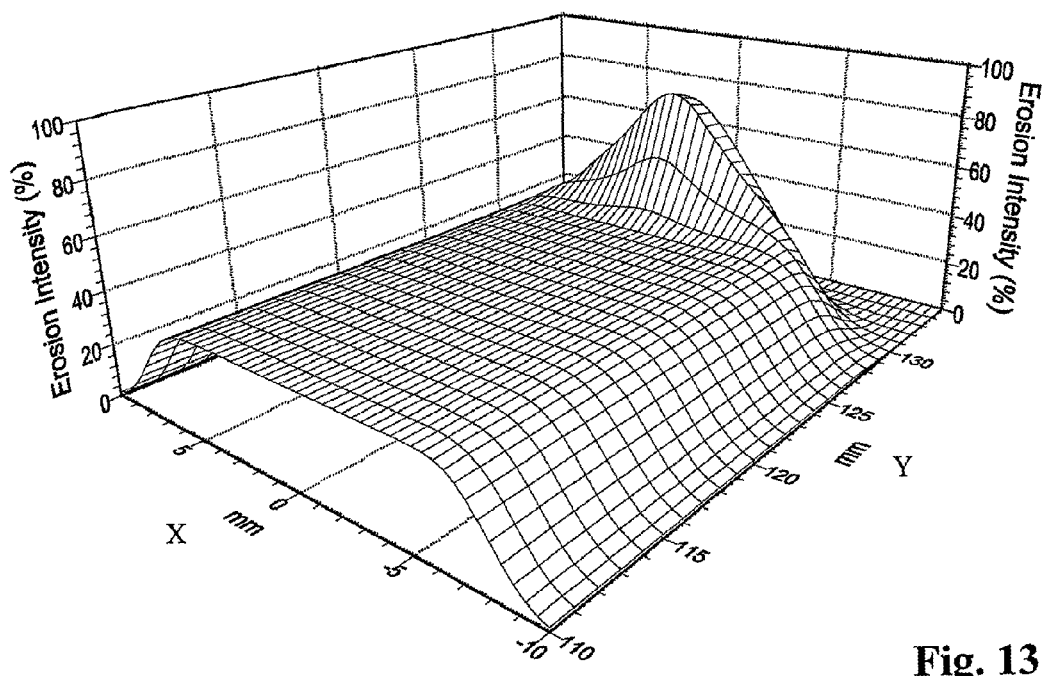
FIG. 13 simulation of resulting erosion profile, at m=0.

FIG. 13 shows a simulation of an erosion profile, at m=l/w=0, i.e. a relative movement only along axis A3. The shape described by the path is, accordingly, only one-dimensional, a line. Simulation tools, usually running on a (personal) computer, are known in the art. Such tools can be employed for obtaining sputtered film thickness distributions for given geometries (target-substrate distance, shape of target and substrate and the like), magnetic fields (shape and amplitude), relative movements (path, speed) of magnetic field and target (possibly also substrate) and sputtering materials. FIG. 13 shows a section of the result of such a simulation.

The conditions (system parameters) for the simulations (calculations) of FIG. 13 were as follows; it is important to notice that the simulated situation is only exemplary.

| Sputtering material | aluminum (Al) |
| --- | --- |
| Length (in Y) of one target (target plate) | 260 cm (L) |
| Width (in X) of one target (target plate) | 20 cm (W) |
| Distance sputtering surface to substr. (panel) | 16 cm (D) |

Magnetron magnet arrangement geometry as shown in FIGS. 2 to 4

The amplitude of the movement in X direction is ±4 cm (in Y direction, it is zero, since m=0).

The erosion profile of FIG. 13 exhibits a pronounced peak located 4.0 cm from the edge having a width of about 1.6 cm.

Figure 14:
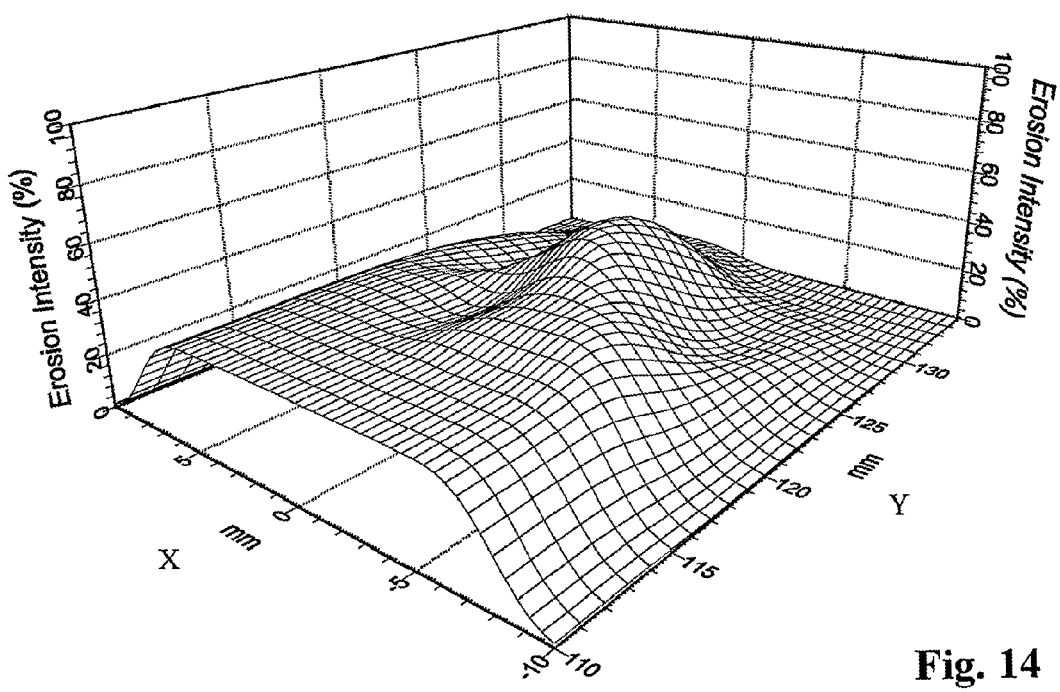
FIG. 14 simulation of resulting erosion profile, at m=2.5.

In FIG. 14 a simulation very similar to that of FIG. 13 is shown. Only the value m is not zero, but the movement describes a rhombus-shaped path like shown in FIG. 5 with m=2.5, i.e., the amplitude of the movement in Y direction (along A4) is 2.5 times the amplitude of the movement in X direction (along A3). I.e., along the X direction the movement is ±4 cm, in Y direction ±10 cm.

The peak in the erosion distribution of FIG. 14 is much less pronounced than in FIG. 13. Accordingly, an improved target utilization is achieved through the rhombus-shaped movement. Location and width of the peak is like in FIG. 13. Hence, a prolonged target lifetime is achieved.

The value m was chosen as m=2.5 in FIG. 14, and it is clearly visible that the peak has been substantially reduced. It is thus possible to control the intensity of the edge peak erosion by controlling the ratio m.

The ratio m is not a fixed number, but can be varied in order to improve the uniformity of the thickness of a sputter-deposited film and/or the uniformity of the target erosion.

The value m can be determined in dependence of at least one of the group consisting of target (sputtering) material, ion type, ion energy, magnetron magnetic field.

When optimizing a uniformity by changing the value of m, as sketched above, one important parameter is the sputtering material. In practice, the magnet arrangement in a given sputtering arrangement is usually given, so that this parameter cannot be varied. An optimized value for m usually will vary with the sputtering material. Different sputtering materials have different Angular Distributions of Sputtered Material (ADSM), and it can thus be advisable to adapt m to different sputtering materials, in particular to different ADSMs. The optimal value for m can be readily calculated from computer simulations which determine the deposited film profile as function of target length, target edge erosion peak intensity, target-substrate distance and target material ADSM. While the value for m may usually be a value >0, in particular a value in the range between substantially 0.01 and 10, it more typically attains values of about 0.5 to 3.

The Angular Distributions of Sputtered Material (ADSM) is a measure for the probability of ejection of sputtering material in a certain direction. The ADSM depends on the sputtering material (target material), the ion type, the ion energy and the ion impact angle.

When an ionized working gas atom hits the sputtering material, several atoms of the sputtering material are ejected. In magnetron sputtering, the working gas ions are hitting the surface with their velocity vector substantially perpendicular to the sputtering surface. In magnetron sputtering, the ions are accelerated in the "dark space", i.e. in a volume with a substantial electric field gradient located near the sputtering surface. In a magnetron plasma, the "dark space" is very thin and parallel to the sputtering surface. The magnetron plasma and the sputtering surface are forming a sort of capacitor in which the electric field lines are perpendicular to its plates, regardless of the plate's geometry. The ejection of sputtering material takes place in virtually all directions, but with different probability, which is given by the ADSM.

In the examples given below, Argon ions ($Ar^+$) are assumed as working gas ions, which impinge perpendicularly onto the sputtering surface having an energy of about 500 eV. Other working gases can, e.g., be other noble gases (e.g., Ne, Kr), and other ion energies may be between 100 eV and 5 kV.

One of the parameters influencing the uniformity to be optimized is the ADSM, which depends on the target material.

Figure 15:
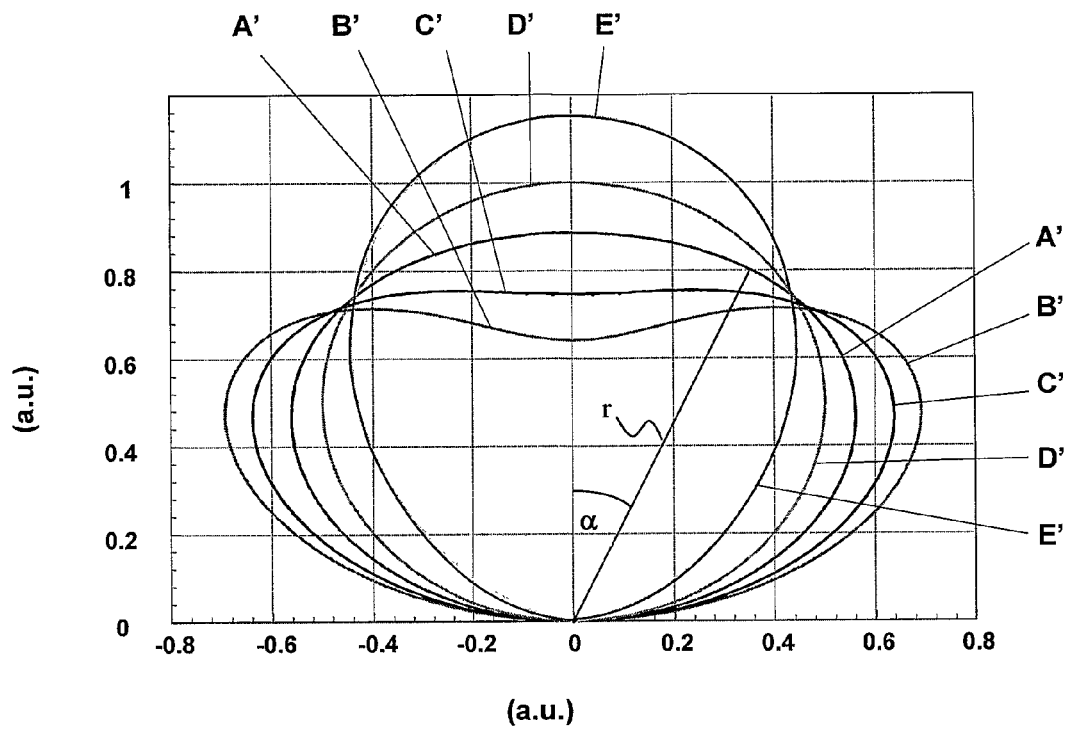
FIG. 15 angular distribution of sputtered material for various (virtual) materials.

FIG. 15 shows the ADSM for five different materials labelled A',B',C',D' and E'. Material A' is Aluminum (Al). The other materials are virtual. The length of the radius vector r is a measure for the probability for emission into a direction inclined versus the surface normal by the angle α (the example in FIG. 15 refers to the sputtering material A').

In analogy to the simulations discussed in conjunction with FIGS. 13 and 14 (same system parameters), simulations were made for finding an optimized value for the ratio m, so as to achieve a good film thickness uniformity on a sputter-coated substrate (required specification: film thickness uniformity). It has been found that, for aluminium as sputtering material, a given target length and width and a given substrate dimensions, an optimized film thickness uniformity and a corresponding target erosion profile is achieved with m=1.804.

If now the sputtering material is changed to one of the other four materials B',C',D',E' (cf. FIG. 15) without changing any of the system parameters (including m), other values of the film thickness uniformity are obtained.

Figure 16:
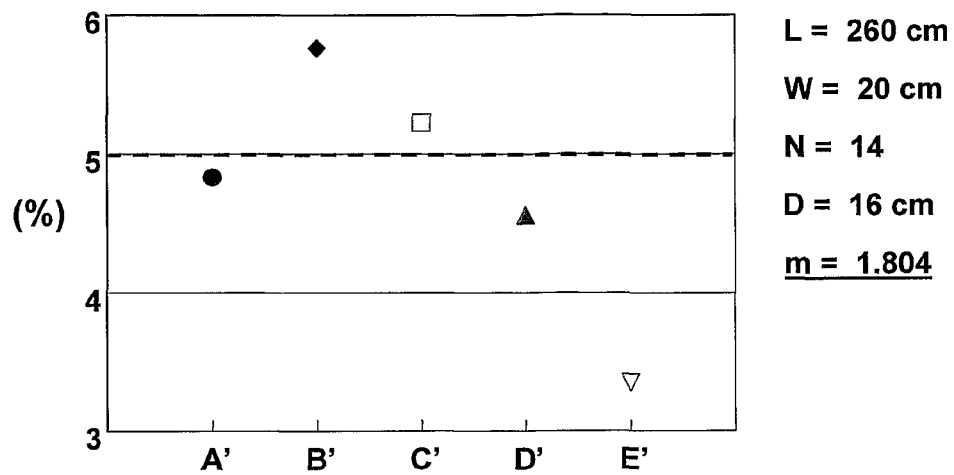
FIG. 16 film thickness uniformity values from simulations for the materials from FIG. 15, at m=1.804.

FIG. 16 shows the resulting film thickness uniformity values for sputter deposition on a substrate with the sputtering materials A',B',C',D',E' (cf. FIG. 15) at m=1.804. The film thickness uniformity value is defined as the difference between the minimum and the maximum film thickness in the sputter-deposited film divided by two times the average film thickness. The system parameters are indicated on the right of FIG. 16. The size of the substrate to be coated is 22 cm×18.5 cm.

A typical requirement (specification) is that the film thickness uniformity has to be better than 5%. It can be seen in FIG. 16 that (for m=1.804) only for the materials A', D' and E' the uniformity is within the specification. Accordingly, for materials A', D' and E' no change of system parameters, in particular no change of the value of m is required. But for two of the materials, B' and C', the film thickness uniformity is out of the specification. Without changing any of the system's mechanical parameters (such as target length L, target-substrate distance D or the like), the film thickness uniformity requirement can be fulfilled for all the five materials only by changing the value of m. Other (electrical, magnetic) parameters can remain unchanged, too.

By means of further simulations for the materials B' and C', values for m have been found, such that an optimized film thickness uniformity is achieved for these materials. Accordingly, the parameter m can be used for fine-tuning the thickness uniformity.

Figure 17:
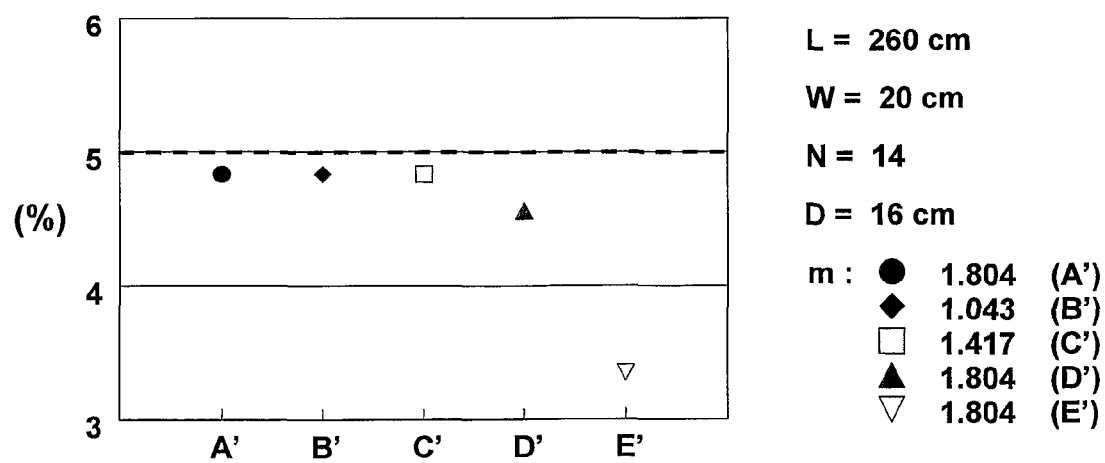
FIG. 17 film thickness uniformity values from simulations for the materials from FIG. 15, at different values for m.

FIG. 17 shows the resulting film thickness uniformity values, all within the specification (<5%). The optimized values for m are 1.043 for material B' and 1.417 for material C'. The aforementioned failure of materials B' and C' to meet the uniformity specification has now been remedied by solely changing the ratio m.

The magnetron sputtering arrangement, and in particular the ratio m, can be optimized in order to meet (as far as possible and) for a given sputtering material's ADSM a given uniformity specification. The control of the ratio m can be done by means of a computer.

It is possible to change the exact value of m over the lifetime of the target (cathode). This feature can be particularly valuable in case of targets comprising or made of a magnetic material or magnetic materials. As the target gets eroded with time, its thickness is changing in a non-uniform way. This is due to the fact that the erosion across the target is non-uniform, even when several optimized system parameters, in particular an optimized value for m, are used. As a result, the overall magnetic field near the surface, which is the magnetron magnetic field, possibly superpositioned with further magnetic fields, e.g., from the sputtering material, is changing in intensity and shape. The resulting magnetic field near the heavily eroded areas is getting strong and has a different shape than in the beginning of target lifetime. As a result, the plasma density increases in these areas of a strong magnetic field. This in return causes higher erosion intensity, which causes the erosion depth in this area to grow even faster. This effect is much more pronounced in case of magnetic sputtering materials than in non-magnetic sputtering materials. A very short target lifetime can result.

One way of solving this issue is to move the magnetron magnetic field relative to the target in order to maintain wide erosion of the sputtering surface. Such motion will substantially increase target utilization. Furthermore, when the erosion has deepened, a different movement may be required due to the changes in the magnetic field. Such changes may increase target utilization even further and also help in maintaning a desired deposited film profile. The relative movements described in this application allow changing motion scheme over time, for example by changing the value m during the sputtering process and/or during the target lifetime.

In case of the FIGS. 13 and 14 a constant speed of the relative movement along the path has been assumed. In practice, it may be necessary to reduce the speed of the relative movement when approaching one of the pointed corners, since in such a corner, the direction of the movement is changed.

Computer simulations have shown that in many cases it can be advantageous to follow the path-shape with its sharp (pointed) corners, in particular the rhombus or diamond shape, rather closely or even as close as mechanically possible.

A movement at high speed tends to decrease local heating of the target and to improve the erosion profile of the sputtering target.

Figure 18:
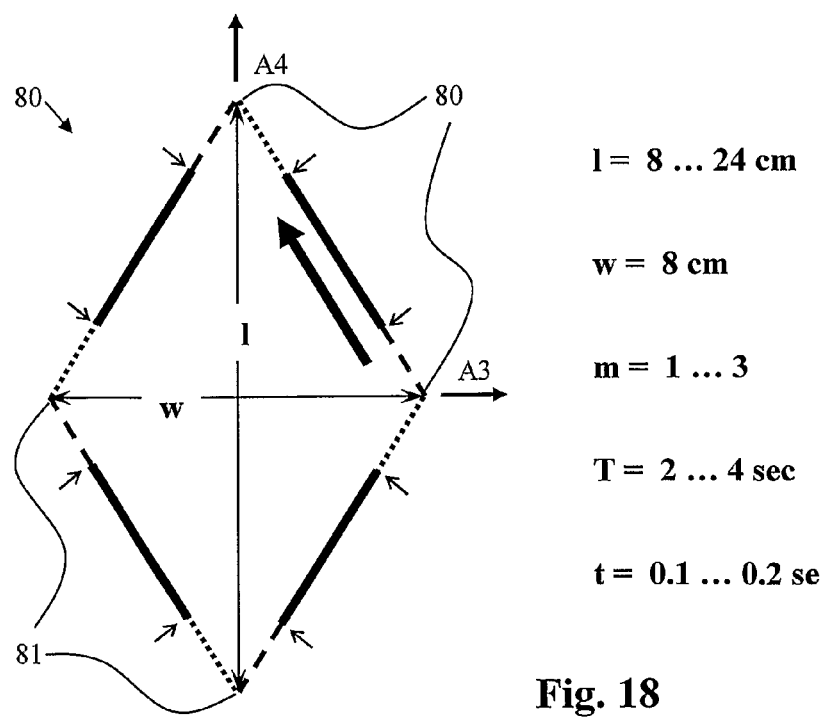
FIG. 18 path of relative movement, with variable speed.
Figure 19:
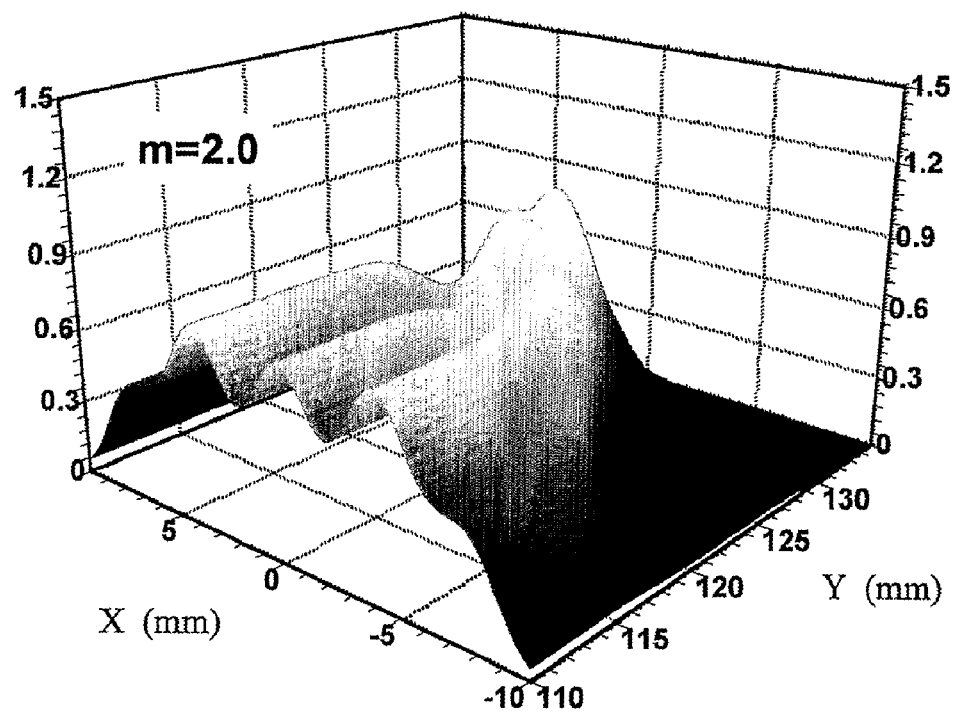
FIG. 19 simulation of target erosion profile at m=2 and variable speed.
Figure 20:
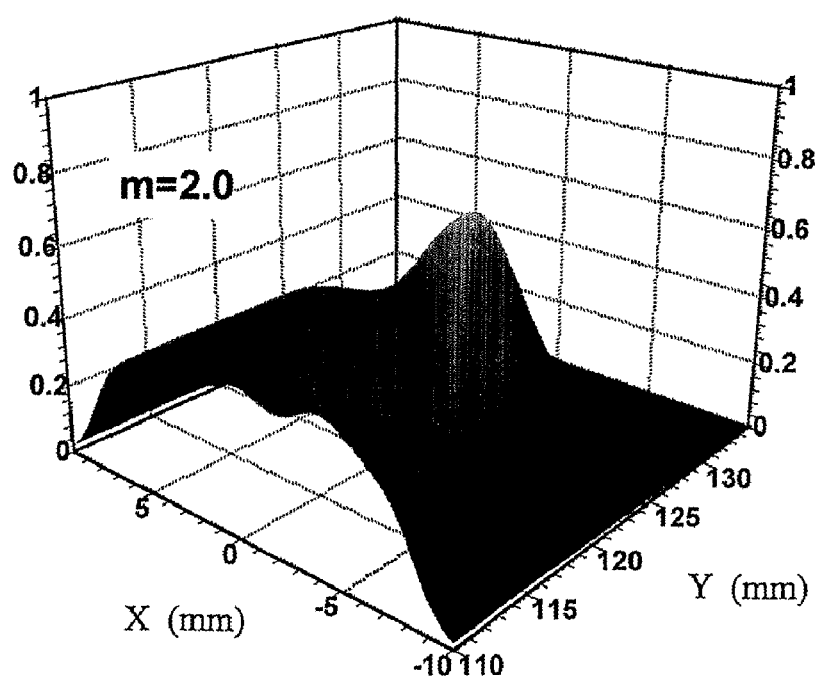
FIG. 20 simulation of target erosion profile at m=2 and variable speed.

Computer simulations have also shown that in many cases it can be advantageous to keep the acceleration and deceleration times along the path relatively low or as low as possible. The latter finding is illustrated in FIGS. 19 and 20, which show simulations of deposited film thicknesses in case of a rhombus-shaped path with m=2 and variable speed. FIG. 18 shows a path 80 with variable speed along the path similar to the path used in the simulations of FIGS. 19 and 20. System parameters are the same as in the simulations above (FIGS. 13, 14), except for m and the speed of the relative movement.

The path 80 in FIG. 18 has sections of motion at substantially constant speed, which are indicated by solid bold lines. Sections, during which speed is reduced (deceleration), are indicated as dotted lines, and sections, during which speed is increased (acceleration), are indicated as dashed lines. The small arrows show, where along the straight lines the different sections start and end, respectively. The bold arrow indicates the sense of the movement.

Typical parameters for the length l of the movement, the width w of the movement, values of m and cycle times T and acceleration/deceleration times t are indicated on the right hand side of FIG. 18. The time during which the movement is accelerated or decelerated near a pointed (sharp) corner 81 of the shape defined by the path 80 can make up as little as 20% or less of the total movement time or as little as 10% or less of the total movement time or even only as little as 5% or less of the total movement time.

The simulation of FIG. 19 shows a target erosion profile when acceleration/deceleration times make up 40% of the total movement time. As can be seen, undesired artefacts ("wavelets") occur, through which the target utilization is reduced. The simulation parameters of the simulation in FIG. 20 are the same, only the acceleration/deceleration times make up only 4% of the total movement time. As can be seen, the "wavelets" are strongly reduced, thus resulting in a better target utilization.

Figure 21:
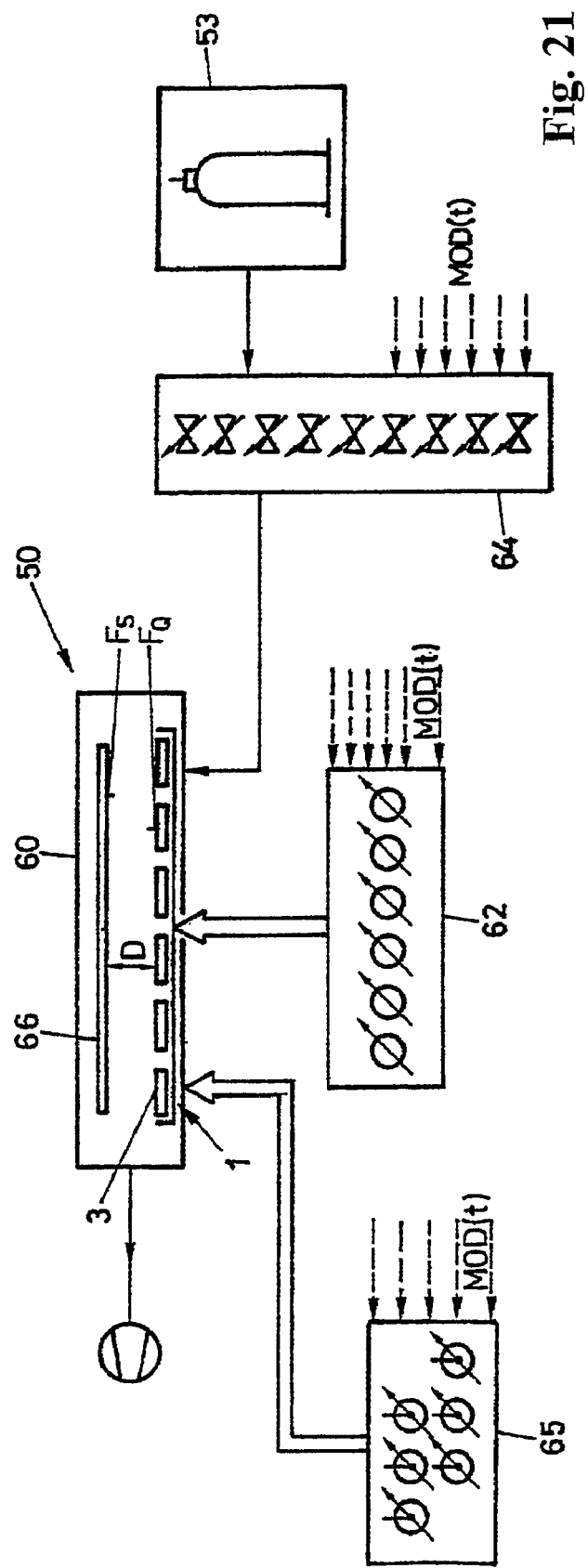
FIG. 21 sputter coating system or vacuum coating facility, schematically.

FIG. 21 schematically shows a sputter coating system 50 with a sputter coating chamber 60, in which is also schematically shown a magnetron sputtering source 1. The schematically shown source 1 features six target arrangements 3 and may be designed as has been explained in conjunction with FIG. 1. The source 1 with its target arrangements is operated with independent electrical supplies that can possibly be modulated, as shown in block 62. Furthermore, the gas inflow conditions—which can possibly be modulated, in particular along the longitudinal dimensions of the target arrangements as shown with servo valve 64—are selectively set in order to let flow a working and/or reactive gas from gas tank 53 into the process chamber 10.

The sputter coating system 50 of FIG. 25 may also be understood as a vacuum coating facility or as a part of such.

By means of drive block 65 a driving means—which can possibly be path/time modulated—for the permanent magnet drums on the source is shown, on which, possibly selectively, the desired drum pendulum motions can be set.

In chamber 60 a substrate holder 66 is provided, in particular for holding a flat substrate to be coated. Based on the capabilities offered by the source 1 of optimally setting the time and location distribution of the material sputtered off by source 1, in particular a uniform distribution that has been averaged over time, in particular also in the edge zones of the source, by choosing an appropriate path of the relative movement and choosing other system parameters appropriately as sketched above, it is possible to make a ratio $V_{QS}$ of the area $F_Q$ of the sputtering surface of the source 1 to the substrate surface $F_S$ to be coated astonishingly small, e.g., $V_{QS} \leq 3$, or $V_{QS} \leq 2$, or $1.5 \leq V_{QS} \leq 2$.

This ratio $V_{QS}$ shows that the material sputtered off the source is used very efficiently because only correspondingly little of the sputtered material is not deposited on the substrate surface. This efficiency is further enhanced because distance D (cf. FIG. 1) between the substrate surfaces to be sputtered and the virgin sputtering surface 4 of the magnetron source 1, can be selected very small, essentially equal to the width of the single sputtering surfaces 4 on target arrangements 3, e.g., 60 mm≦D≦250 mm or 80 mm≦D≦160 mm. Through said small distances D a high deposition rate is achieved with high sputtering efficiency which results in a highly economical coating process.

The magnetron sputtering source 1 and the sputtering chamber 10 or system are well suited for magnetron sputter-coating substrates with a high-quality film, with desired distribution of the film thickness, in particular a homogeneous film thickness distribution in combination with high process economy. As a consequence, the invention can be also used for coating large-surface semiconductor substrates, but in particular for coating substrates of flat display panels, in particular TFT or PDP panels. The source 1 can be used for reactive coating of said substrates, in particular with ITO films or for metal-coating said substrates through non-reactive sputter coating.

This invention can be also used for coating magnetic material with high target utilization.

In the following examples possible sizes of the source 1 or the chamber 10 or the vacuum coating facility are given.

Geometry:

Lateral distance d between adjacent targets in a multi-target arrangement: maximum 15%, or maximum 10%, or even maximum 7% of the width B of a single target arrangement and/or 1 mm≦d≦230 mm, or 7 mm≦d≦20 mm; virgin surfaces of the target arrangements 3 arranged along one plane; width B of the target arrangements: 60 mm≦B≦350 mm, or 80 mm≦B≦200 mm; length L of the target arrangements : at least B, typically considerably longer, e.g., 400 mm≦L≦2000 mm; end area of the targets : e.g., rectangular or semicircular.

Source/Substrate:

Ratio $V_{QS}$ of the area $F_Q$ of sputtering surface 4 to the area of the substrate surface $F_S$ to be coated: $V_{QS}$≦3. Smallest distance of the virgin source surfaces/coating surfaces D: e.g., 60 mm≦D≦250 mm; substrate sizes: e.g., 750 mm×630 mm, coated with a source having a sputtering surface 4 of: 920 mm×900 mm, or substrate size: 1100 mm×900 mm, with a source having a sputtering surface 4 of: 1300×1200 mm.

Cooling: ratio of sputtering surface 4 to cooling surface $V_{SK}$: 1.2≦$V_{SK}$≦1.5.

Figure 22:
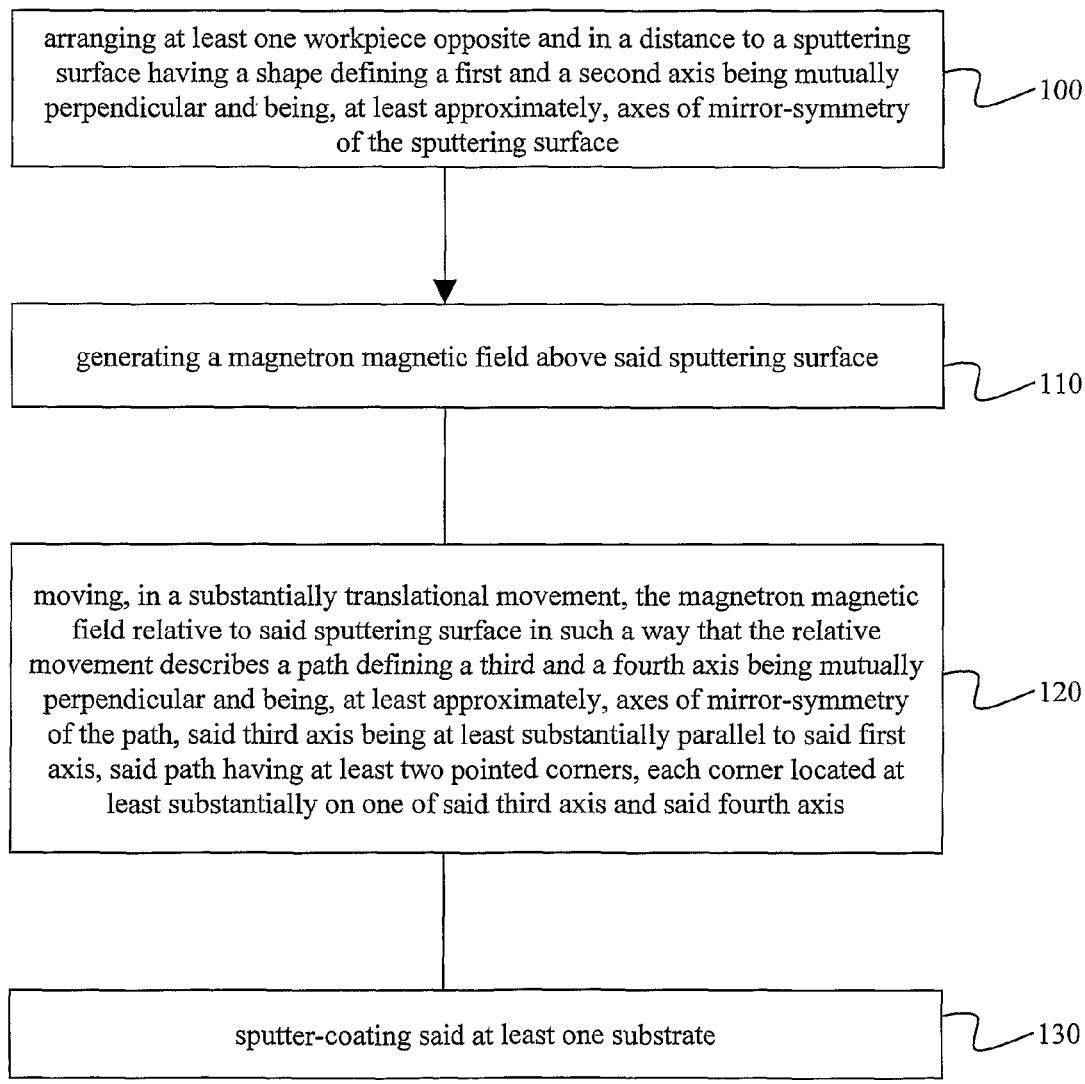
FIG. 22 block diagram of a method of manufacturing a sputter-coated work piece.

Operating variables: target temperature T: 40° C. ≦T≦150° C., or 60° C. ≦T≦130° C.; sputter power per unit sputtering surface: 10 W/cm$^2$ to 30 W/cm$^2$, or 15 W/cm$^2$ to 20 W/cm$^2$ FIG. 22 shows a block diagram of a method of manufacturing, according to the invention, a sputter-coated workpiece. The reference symbols 100 to 130 depict steps of the method. Firstly, the at least one workpiece is arranged opposite and in a distance to a sputtering surface having a shape defining a first and a second axis being mutually perpendicular and being, at least approximately, axes of mirror-symmetry of the sputtering surface. Then, while a magnetron magnetic field is generated above said sputtering surface, the magnetron magnetic field is moved, in a substantially translational movement, relative to said sputtering surface in such a way that the relative movement describes a path defining a third and a fourth axis being mutually perpendicular and being, at least approximately, axes of mirror-symmetry of the path, said third axis being at least substantially parallel to said first axis, said path having at least two pointed corners, each corner located at least substantially on one of said third axis and said fourth axis, and said at least one substrate is sputter-coated.

The materials most commonly used in the display industry are Aluminum, ITO and other metallic and ceramic materials. But the invention is not limited to such materials and also includes any thinkable material that can be sputter-eroded or used for forming thin films in a sputtering process.

It has been shown that it is possible to achieve controlled, and in particular rather uniform sputter erosion profiles even without the need for soft iron pieces as suggested in above-mentioned U.S. Pat. No. 6,416,639. This is achieved by changing the shape or parameters of the relative movement of the magnet array and the target, e.g., of the movement of the magnet array with the target fixed.

The movement and the parameter m and the speed of the movement are easily adaptable, because this can be done by computer with a suitable software. The present invention also allows to adapt a sputtering process to different sputtering materials without the need to disassemble the sputtering arrangement for introducing soft iron pieces or the like.

The sputtering arrangement and sputtering method allows for an increased target utilization. The movement can be software-controllable. It has several technical and/or economic advantages and achievements:

The material costs per substrate are lower, due to the higher utilization of the sputtering (cathode) material.

Maintenance intervals are increased, due to the higher utilization of the sputtering (cathode) material.

The set-up time for changing a sputtering (cathode) material is reduced, due to the control of the magnet movement, e.g., by software, making arranging soft iron pieces superfluous.

The ability to vary the erosion profile without modifications of the magnet array and geometrical modifications.

The movement along above-described shapes.

The adaption of the value m by computer simulation.

Clarifying the influence of acceleration/deceleration times along the path shape on the thickness uniformity.

LIST OF REFERENCE SYMBOLS

| | |
|---|---|
| 1 | magnetron sputtering source |
| 2 | magnetron sputtering arrangement |
| 3 | target arrangement |
| $3_{a1}$ | target, sputtering target, target plate, cathode |
| 4 | sputtering surface |
| 6 | race tracks, plasma race tracks |
| 8 | substrate |
| 10 | process chamber |
| 40 | magnet arrangement, magnetron magnet arrangement, permanent magnet arrangement, magnet configuration |
| 42, 42a, 42b, 42c, 42d, 42e, 42f | permanent magnet |
| 48 | magnetron magnetic field |
| 50 | sputter coating system |
| 53 | gas tank arrangement |
| 60 | sputter coating chamber |
| 62 | generator |
| 64 | valve, servo valve |
| 65 | drive block |
| 66 | substrate holder |
| 70 | drive, x-y-drive, X-Y-table, spindle drive, motor spindles, linear drives, dual linear drive |
| 71 | base plate, plate of X-Y table |
| 80 | path |
| 81 | corner of path, pointed corner |
| 100 | step |
| 110 | step |
| 120 | step |
| 130 | step |
| A1 | first axis |
| A2 | second axis |

| | |
|---|---|
| A3 | third axis |
| A4 | fourth axis |
| B | width of individual target arrangement |
| d | lateral distance between individual target arrangements |
| D | distance between virgin sputtering surface and substrate |
| $F_Q$ | sputtered source surface, area of sputtering surface |
| $F_S$ | substrate surface, area of substrate surface |
| $H_z$ | direction |
| l | length of path along fourth axis |
| B | length of individual target arrangement |
| m | value representative of a ratio of the maximum extension of the path parallel to the fourth axis to the maximum extension of the path parallel to the third axis; ratio of length to width of shape defined by the path |
| r | radius vector |
| t | time during which acceleration or deceleration takes place (during one cycle of a repetitive movement) |
| T | cycle time (period) of repetitive movement |
| w | width of path along third axis |
| X | coordinate, lateral direction |
| Y | coordinate, lateral direction |
| Z | coordinate |

The invention claimed is:

1. Magnetron sputtering (2) arrangement comprising
a target arrangement (3) comprising a target (3ai) having a sputtering surface (4) the shape of which defines a first (A1) and a second axis (A2) being mutually perpendicular and being, at least approximately, axes of mirror-symmetry of the sputtering surface;
a magnet arrangement (40) generating a magnetron magnetic field above said sputtering surface (4); and
a drive (70) operatively connected to at least one of the magnet arrangement and the target arrangement for establishing a substantially transitional relative movement between said magnetron magnetic field and said sputtering surface (4);
said relative movement describing a path (80) defining a third (A3) and a fourth axis (A4) being mutually perpendicular and being, at least approximately, axes of mirror-symmetry of the path, said third axis (A3) being at least approximately parallel to said first axis, and said path (80) having at least two pointed corners (81), each corner located at least substantially on one of said third axis (A3) and said fourth axis (A4).

2. Arrangement according to claim 1, wherein said target is of oblong shape, and a maximum extension of said sputtering surface parallel to said first axis is larger than a maximum extension of said sputtering surface parallel to said second axis.

3. Arrangement according to claim 1, said sputtering surface defines a generally rectangular shape.

4. Arrangement according to claim 1, wherein the relative movement is a repetitive movement.

5. Arrangement according to claim 1, wherein the path has at least four pointed corners, each corner located at least substantially on one of said third axis and said fourth axis.

6. Arrangement according to claim 1, wherein there is valid at least one of: the largest extension of said path parallel to said third axis is located on said third axis, and the largest extension of said path parallel to the fourth axis is located on said fourth axis.

7. Arrangement according to claim 1, wherein the path describes substantially the shape of a rhombus.

8. Arrangement according to claim 1, wherein a value m representative of a ratio of the maximum extension of said path parallel to said fourth axis to the maximum extension of said path parallel to said third axis is between 0 and 10.

9. Arrangement according to claim 8, wherein the value m is obtained in dependence of the material of the sputtering surface.

10. Arrangement according to claim 1, wherein the maximum extension of the sputtering surface parallel to the first axis is at least four times the maximum extension of the sputtering surface parallel to the second axis.

11. Arrangement according to claim 1, wherein the target is substantially bar-shaped.

12. Arrangement according to claim 1, wherein the sputtering surface is stationary.

13. Magnetron sputtering arrangement according to claim 1, comprising at least two of said
target arrangements;
magnet arrangements; and
drives.

14. Arrangement according to claim 13, wherein the drives are embodied as one drive.

15. Arrangement according to claim 13, wherein the target arrangements are substantially of the same kind.

16. Arrangement according to claim 13, wherein the magnet arrangements are substantially of the same kind.

17. Arrangement according to claim 13, wherein the target arrangements are mutually electrically isolated.

18. Arrangement according to claim 13, wherein the paths describe substantially the same shape.

19. Sputter coating chamber comprising at least one magnetron sputtering arrangement according to claim 1, and comprising at least one substrate holder for holding a substrate to be sputter-coated, arranged distant and opposite to said sputtering surface.

20. Vacuum coating facility comprising at least one magnetron sputtering arrangement according to claim 1.

21. Method of operating a magnetron sputtering arrangement comprising a target arrangement having a target having a sputtering surface the shape of which defines a first and a second axis being mutually perpendicular and being, at least approximately, axes of mirror-symmetry of the sputtering surface, comprising the steps of:
generating a magnetic field above said sputtering surface; and
moving, in a substantially translational movement, the magnetic field relative to said sputtering surface in such a way that the relative movement describes a path defining a third and a fourth axis being mutually perpendicular and being, at least approximately, axes of mirror-symmetry of the path, said third axis being at least approximately parallel to said first axis, and said path having at least two pointed corners, each corner located at least substantially on one of said third axis and said fourth axis.

22. Method according to claim 21, further comprising the steps of:
for each of the at least two pointed corners:
reducing the velocity of the relative movement before reaching the pointed corner;
increasing the velocity of the relative movement after having reached the pointed corner;
and further comprising the step of:
moving, during said relative movement, the magnetron magnetic field relative to said sputtering surface at a substantially constant speed during at least 80% of the time of the relative movement.

23. Method according to claim 21, wherein the path describes substantially the shape of a rhombus.

24. Method of manufacturing at least one sputter-coated work piece, comprising the steps of:
arranging the at least one workpiece opposite and in a distance to a sputtering surface having a shape defining a first and a second axis being mutually perpendicular and being, at least approximately, axes of mirror-symmetry of the sputtering surface;
generating a magnetron magnetic field above said sputtering surface;
moving, in a substantially translational movement, the magnetron magnetic field relative to said sputtering surface in such a way that the relative movement describes a path defining a third and a fourth axis being mutually perpendicular and being, at least approximately, axes of mirror-symmetry of the path, said third axis being at least substantially parallel to said first axis, and said path having at least two pointed corners, each corner located at least substantially on one of said third axis and said fourth axis;
sputter-coating said at least one substrate.

25. Method according to claim 24, wherein the path describes substantially the shape of a rhombus.

26. Method according to claim 24, wherein a value m representative of a ratio of the maximum extension of the path parallel to the fourth axis to the maximum extension of the path parallel to the third axis is obtained in dependence of the material of the sputtering surface.

27. Method for improving the erosion profile across a sputtering surface of a sputtering target comprising sputtering material, which eroding is done in a magnetron-sputtering process, in which a magnetic field is moved in a substantially translational movement relative to said sputtering surface in such a way that the relative movement describes a path defining a third and a fourth axis being mutually perpendicular and being, at least approximately, axes of mirror-symmetry of the path, said sputtering surface having a shape defining a first and a second axis being mutually perpendicular and being, at least approximately, axes of mirror-symmetry of the sputtering surface, and said third axis being at least substantially parallel to said first axis, comprising the step of:
choosing a value m representative of a ratio of the maximum extension of the path parallel to the fourth axis to the maximum extension of the path parallel to the third axis in dependence of the sputtering material.

28. Method according to claim 27, comprising the step of varying the value m over the lifetime of the sputtering target.

29. Method according to claim 27, wherein said path having at least two pointed corners, each corner located at least substantially on one of said third axis and said fourth axis.

30. Arrangement according to claim 1, wherein a value m representative of a ratio of the maximum extension of said path parallel to said fourth axis to the maximum extension of said path parallel to said third axis is between 0.3 and 3.

31. Arrangement according to claim 1, wherein a value m representative of a ratio of the maximum extension of said path parallel to said fourth axis to the maximum extension of said path parallel to said third axis is between 0.38 and 2.6.

32. Arrangement according to claim 1, wherein a value m representative of a ratio of the maximum extension of said path parallel to said fourth axis to the maximum extension of said path parallel to said third axis is between 0.41 and 2.4.

33. Arrangement according to claim 1, wherein the maximum extension of the sputtering surface parallel to the first axis is at least six times the maximum extension of the sputtering surface parallel to the second axis.

34. Arrangement according to claim 1, wherein the maximum extension of the sputtering surface parallel to the first axis is at least eight times the maximum extension of the sputtering surface parallel to the second axis.

35. Magnetron sputtering arrangement according to claim 1, comprising at least three of said
target arrangements;
magnet arrangements; and
drives.

36. Method according to claim 21, further comprising the steps of:
for each of the at least two pointed corners:
reducing the velocity of the relative movement before reaching the pointed corner;
increasing the velocity of the relative movement after having reached the pointed corner;
and further comprising the step of:
moving, during said relative movement, the magnetron magnetic field relative to said sputtering surface at a substantially constant speed during at least 90% of the time of the relative movement.

37. Method according to claim 21, further comprising the steps of:
for each of the at least two pointed corners:
reducing the velocity of the relative movement before reaching the pointed corner;
increasing the velocity of the relative movement after having reached the pointed corner;
and further comprising the step of:
moving, during said relative movement, the magnetron magnetic field relative to said sputtering surface at a substantially constant speed during at least 95% of the time of the relative movement.

* * * * *